United States Patent
Hanham et al.

(10) Patent No.: US 10,404,279 B2
(45) Date of Patent: *Sep. 3, 2019

(54) LOW BER HARD-DECISION LDPC DECODER

(71) Applicant: Toshiba Memory Corporation, Minato-ku, Tokyo (JP)

(72) Inventors: Paul Edward Hanham, Didcot (GB); David Malcolm Symons, Kidlington (GB); Neil Buxton, Reading (GB)

(73) Assignee: Toshiba Memory Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/137,947

(22) Filed: Sep. 21, 2018

(65) Prior Publication Data

US 2019/0103882 A1 Apr. 4, 2019

Related U.S. Application Data

(63) Continuation of application No. 14/325,256, filed on Jul. 7, 2014, now Pat. No. 10,084,479.

(51) Int. Cl.
| | |
|---|---|
| H03M 13/00 | (2006.01) |
| H03M 13/11 | (2006.01) |
| G06F 11/10 | (2006.01) |
| H03M 13/29 | (2006.01) |
| H03M 13/37 | (2006.01) |
| H03M 13/15 | (2006.01) |
| G11C 29/04 | (2006.01) |

(52) U.S. Cl.
CPC ..... *H03M 13/1108* (2013.01); *G06F 11/1012* (2013.01); *H03M 13/1111* (2013.01); *H03M 13/2906* (2013.01); *H03M 13/3707* (2013.01); *H03M 13/3715* (2013.01); *G11C 2029/0411* (2013.01); *H03M 13/152* (2013.01)

(58) Field of Classification Search
CPC ......... H03M 13/1108; H03M 13/3715; H03M 13/2906; H03M 13/3707; H03M 13/1111; H03M 13/43; H03M 13/1128; H03M 13/159; G06F 11/1068; G06F 11/1012
USPC ........ 714/752, 773, 774, 800–805, 785, 793
See application file for complete search history.

(56) References Cited

U.S. PATENT DOCUMENTS

| 4,667,327 | A  | * | 5/1987 | Bright ............. G01R 31/31853 714/775 |
| 5,157,671 | A  |   | 10/1992 | Karplus |
| 6,910,178 | B1 | * | 6/2005 | Kiselev ................. G06F 11/183 714/797 |
| 8,051,363 | B1 |   | 11/2011 | Liu |
| 2006/0136799 | A1 |   | 6/2006 | Choi et al. |
| 2007/0011586 | A1 |   | 1/2007 | Belogolovyi et al. |

(Continued)

*Primary Examiner* — Albert Decady
*Assistant Examiner* — Osman M Alshack
(74) *Attorney, Agent, or Firm* — White & Case LLP

(57) ABSTRACT

A non-volatile memory controller includes a hard-decision Low Density Parity Check (LDPC) decoder with a capability to dynamically select a voting method to improve the decoding in low bit error rate (BER) situations. The hard-decision LDPC decoder dynamically selects a voting method associated with a strength requirement for bit flipping decisions. In one implementation, the voting method is selected based on the degree of a variable node and previous syndrome values.

10 Claims, 7 Drawing Sheets

(56) References Cited

U.S. PATENT DOCUMENTS

| | | | |
|---|---|---|---|
| 2008/0028274 A1* | 1/2008 | Lin | H03M 13/1108 714/752 |
| 2009/0222711 A1 | 9/2009 | Belogolovy | |
| 2009/0249174 A1 | 10/2009 | Lamb | |
| 2010/0005373 A1 | 1/2010 | Bisen et al. | |
| 2010/0042890 A1* | 2/2010 | Gunnam | H03M 13/1111 714/752 |
| 2011/0246862 A1* | 10/2011 | Graef | H03M 13/1108 714/785 |
| 2011/0293045 A1* | 12/2011 | Gross | H04L 1/005 375/340 |
| 2014/0082459 A1* | 3/2014 | Li | G06F 11/1666 714/773 |
| 2014/0153625 A1* | 6/2014 | Vojcic | H04L 1/005 375/224 |
| 2015/0026536 A1* | 1/2015 | Hubris | G06F 11/1048 714/758 |
| 2015/0052413 A1* | 2/2015 | Eleftheriou | H03M 13/1108 714/758 |
| 2015/0188570 A1* | 7/2015 | Kwok | G06F 11/1076 714/764 |

* cited by examiner

| Address | Entry 0 | | | Entry 1 | | | Entry 2 | | | Entry 3 | | | Entry 4 | | |
|---|---|---|---|---|---|---|---|---|---|---|---|---|---|---|---|
| | Voting Type | Address Incr | Band Length | Voting Type | Address Incr | Band Length | Voting Type | Address Incr | Band Length | Voting Type | Address Incr | Band Length | Voting Type | Address Incr | Band Length |
| 0 | V | 4 | 3 | T3 | 1 | 1 | T3 | 2 | 1 | V | 4 | 30 | V | 3 | -1 |
| 1 | T3 | 4 | 3 | T23 | 5 | 1 | T3 | 4 | -1 | | | | | | |
| 2 | T3 | 2 | -1 | | | | | | | | | | | | |
| 3 | V | 2 | -1 | | | | | | | | | | | | |
| 4 | V | 1 | -1 | | | | | | | | | | | | |
| 5 | V | -1 | -1 | | | | | | | | | | | | |
| 6 | V | 1 | -1 | | | | | | | | | | | | |
| 7 | T3 | -1 | -1 | | | | | | | | | | | | |

FIG. 5

LOW BER HARD-DECISION LDPC DECODER

CROSS-REFERENCE TO RELATED CASES

This application is a continuation of application Ser. No. 14/325,256, filed Jul. 7, 2014, the entire contents of which is incorporated herein by reference.

FIELD OF THE INVENTION

The present invention is generally related to systems and methods to adapt a Hard-Decision (bit flipping) Low Density Parity Check (LDPC) Decoder to improve the capability to correct errors in low Bit Error Rate (BER) situations. More particularly, the present invention is directed to an improved LDPC decoder for low BER situations in the context of decoding information for a non-volatile memory.

BACKGROUND OF THE INVENTION

Due to the increasing bit density of NAND flash memories and the associated smaller process geometries, there has been greater emphasis on improving the error correction capability provided by NAND flash memory controllers. Error correction is necessary due to the nature of the technology where reliability and endurance become increasing problems as flash density increases.

NAND flash memory technology depends on the storage of a trapped charge on a floating gate of a transistor which comprises the memory cell. The amount of charge which is stored will vary the threshold voltage, (VT), which is the voltage when applied to a separate control gate which will cause the transistor to conduct. In order to read the memory cell, a voltage is applied to the control gate and the current which flows between the source and drain is measured. The amount of current will vary according to the charge stored on the floating gate.

Originally, flash memory cells were designed to store only a single bit, where the cell was either programmed to store a charge, or left un-programmed with no charge stored. The threshold voltage when a charge was stored would be much higher than if it were not. In order to distinguish between the two states, a voltage would be applied which was in between the two threshold voltages. If the transistor conducted, it could be assumed that no charge was stored (as the voltage applied would be above the threshold voltage of the un-programmed cell). If, however, the transistor did not conduct, then it could be assumed that a charge was stored (as the voltage applied would be below the threshold voltage of the programmed cell).

However, the mechanism for programming a stored charge is relatively imprecise. In an array of memory cells, there may be variations in cell parameters due to the position or layout of the cells in the array. Also, process variations in the manufacture of the silicon slices to make the flash memory dies may cause variations between dies used in different devices or between multiple dies on the same device. The result of this would be that the stored charge could lie anywhere on a distribution curve, which is often approximated by a normal or Gaussian distribution due to these variations.

Similarly, the mechanism for erasing a stored charge is subject to variation, where a cell that was previously programmed and then erased, may still hold some variable amount of residual charge. Erasing flash cells is conducted in bulk, with a whole block of memory cells erased at a time. Further, with repeated erasure and reprogramming, flash cells deteriorate over time and exhibit increased propensity to cell variations, until finally the cells may fail completely.

The stored charge may also be subject to modification due to effects such as leakage of charge over time due to imperfections in the insulating or semiconductor layers comprising the cell, or there may be additional charge variations due to so-called 'disturb' effects where adjacent cells being programmed or read may result in addition or leakage of charge to/from surrounding adjacent cells due to parasitic capacitance coupling and other effects.

Hence, there are many statistical and random effects upon a cell, which, while notionally initially 'programmed' to a certain charge level, might subsequently hold a charge that was lower than the voltage chosen to distinguish between the charge states, appearing on reading to be a cell that was not programmed In effect a read error would occur. Equally, a cell that was not programmed might accumulate sufficient charge due to statistical and random effects that makes the cell appear on reading to be programmed, causing a read error in the opposite direction.

This problem is compounded by the trend to move from storing a single bit per cell in SLC (single level cell) memory towards storing 2 or 3 bits per cell in MLC (multi level cell) and TLC (triple level cell). With MLC and TLC, a single cell is still used to store a charge, but as the terms suggest, multiple levels of charge are defined to represent multiple bit states. Where two bits per cell are used, 4 levels of charge are defined, including the erased or non-charged state. Where three bits per cell are used, 8 levels of charge are defined. When more levels are squeezed in to the same range of charge state, the charge levels and corresponding threshold voltages become closer together. This means that closer tolerances are required in order to distinguish between the different cell charge distributions used to represent the bit states, and it also means that smaller amounts of charge injection or leakage will more easily result in movement of the stored charge from the original programmed level to adjacent levels. The net result is that with multiple bits per cell, read errors become more prevalent.

A flash memory is generally organized in units of pages which are the smallest unit which are individually programmable. A block, which is the smallest unit which can be erased, is composed of multiple pages. A page of memory is provided with a spare area, which is used for the extra bits required for ECC, as well as other functions such as bits for keeping track of wear leveling and other metadata. The spare area was originally sized to be large enough to accommodate enough bits to provide for BCH (Bose Chaudhuri Hocqenghem) type codes for error correction given the expected error rates of memories at the time. BCH error correction codes are extensively used to correct read errors in NAND flash memories, primarily because they have the property that they can be flexibly designed to correct a precise number of errors in a block of data (meaning that data block of a given size and expected error rate can be exactly reconstructed with certainty), wherever and however they may occur (i.e. randomly distributed, in fixed patterns or in bursts). They are also relatively simple to implement decoders (usually the most complex part of an ECC codec) using the syndrome decoding algebraic method. As such, BCH codes could be specifically designed to work with a given flash memory data page and spare area size. However, the greater requirements placed on the ability to cope with greater error rates in more dense NAND flash memories, along with greater requirements for longer memory endurance in enterprise computing applications as opposed to consumer applications, has meant that BCH codes have become incapable of being economically or feasibly scaled to meet the new requirements.

As a result, Low Density Parity Codes (LDPC) codes are now commonly used. LDPC codes provide greater coding efficiency than BCH (in terms of the number of bits in data block which are in error, compared with the number of extra bits needed to form the codewords from the data block). However, they suffer the disadvantage that decoding is a more complex and involves an iterative process which may not always converge to an exact answer. Their success at converging on a solution can be improved by providing additional probability information regarding the likelihood or belief about which bits are in error. With BCH codes, the result of a single read operation of a page memory cells using a single sensing threshold voltage is sufficient to operate the decoding operation. Either each bit is returned correctly, or if it is in error, no information is provided about where the actual value of stored charge may lie on the possible Gaussian distribution curve. This is termed 'hard-decision' memory sensing. Alternative improved schemes have been designed which involve performing multiple read operations using different threshold sensing voltages. The results from these multiple read operations can then be used to provide additional 'soft information' which can indicate approximately where on the Gaussian distribution curve the cell charge may lie. This method is termed 'soft-decision' memory sensing. However, this method results in a much slower overall read operation, with much increased read latency considerably reducing the read I/O bandwidth. It may also only start to offer advantages as the memory ages or data retention time increases, where the cell charge moves further away from the centre of the Gaussian distribution curve and starts to enter the overlap area of the adjacent charge level distribution curves. In this case, the reduction in memory read I/O performance as the device ages may be an acceptable tradeoff in return for extending the error correction capability.

Therefore, LDPC decoding is generally conducted using hard-decision decoding in the early lifetime of the flash memory as this offers reasonable decoder error correction capability with no loss in performance due to increased read latency. As the flash memory ages and the error rates increase, the decoding capability is increased if soft-decision decoding is employed as more information is provided to the decoder as to the likelihood of which bits may be in error, but at the expense of increased read latency and reduced read performance.

With BCH codes, as long as the number of errors in the memory page (including the extra error protection bits in the spare area) does not exceed the correction capability of the code, the original data is guaranteed to be decodable. With LDPC, this is no longer the case, and the iterative decoding process may not converge on a solution. In particular, this may happen even if there are only a low number of errors in the page, which is more likely to happen early in the life of a NAND flash memory when error rates are low. If the decoding does not converge on a solution, this means that no information can be discerned with any certainty about any of the bits in the whole page which may be in error, effectively resulting in the whole page being rejected and a page read error being returned, which is a major failure in the read process. This may happen early in the life of the memory, where it would be expected that low rates of error can be corrected easily. It is only when the memory ages or data is retained for long periods that error rates rise to such an extent that the error correction cannot cope.

In soft-decision decoding, the resulting page error rate is very dependent on the quality (accuracy) of the soft information. While multiple reads do provide soft information in terms of the likelihood of the bit being read being a '0' or a '1', it applies only to that instance, where the bit has either been written as a '0' or a '1'. However, it is known (for example), that bit positions in flash pages may have asymmetrical error properties, where the likelihood of a '0' written to the flash turning into a '1' is very different from the likelihood of a '1' becoming a '0'. Also, error properties may vary between odd and even flash pages and the position of a page within a flash data block.

In addition, there are other non-volatile memory technologies that have been developed, including Phase Change Memory (PCM), Magneto-resistive RAM (MRAM), Spin Torque Transfer MRAM (STT-MRAM) Ferro-electric RAM (FeRAM or FRAM), which also suffer from memory cell degradation and subsequent read errors. These technologies may therefore also employ error correction techniques, including BCH and LDPC encoding and decoding.

Therefore, what is needed is a method to improve the decodability of LDPC codes using hard-decision decoding for non-volatile memories when data error rates are low and where soft-decision decoding may not offer any improvement in the ability of the decoder to converge on a solution.

SUMMARY OF THE INVENTION

A NAND flash non-volatile memory controller includes a hard-decision Low Density Parity Check (LDPC) decoder with a capability to dynamically select a voting method to improve the decoding in low bit error rate "(BER) situations. In one implementation, the voting method is selected based on the degree of a variable node and previous syndrome values.

In one embodiment, a NAND flash non-volatile memory controller includes a hard-decision Low Density Parity Check (LDPC) decoder to decode encoded data received from the flash memory. The hard-decision LDPC decoder including means for dynamically adjusting voting algorithms in at least a low bit error rate (BER) regime to adjust a strength requirement for bit flipping, which may involve either strengthening or weakening the requirements.

BRIEF DESCRIPTION OF THE DRAWINGS

FIG. 5 is a table illustrating aspects of a method of hard-decision LDPC decoding in accordance with an embodiment of the present invention.

DETAILED DESCRIPTION

Blocks of memory holding a frames of data with a only a small number of errors are very common in many non-volatile memory systems, particularly with NAND Flash non-volatile memories. Conventional hard-decision LDPC decoding will not always successfully decode even a small numbers of errors in a data frame.

The present invention is generally related to an apparatus, system, and method to dynamically adjust the voting methods used for hard-decision LDPC decoding to improve the decoding in low Bit Error Rate (BER) situations in a data frame. The voting method is adjusted to strengthen or weaken the requirements for bit flipping.

It is noted that while the term "voting method" is used in accordance with the art, equivalent terms such as a "voting algorithm" or a "voting technique" may be used, if desired, when useful to avoid confusion when describing inventive method, system, or apparatus embodiments.

An exemplary application is in the context of a flash memory controller in a solid state drive (SSD). In one embodiment, the hard-decision LDPC decoder is implemented as a sub-core of the flash-controller core as part of a larger error correction scheme.

Dynamically altering the voting method reduces the number of frames entering a hard-decision LDPC decoder with a small number of errors and exiting the hard-decision LDPC decoder still unsuccessfully decoded. This reduces the requirement for post hard-decision LDCP decode error correction and with this the associated power and latency. In one embodiment, the voting method is adjusted based on the degree of variable nodes and previous syndrome values.

Figure 1:
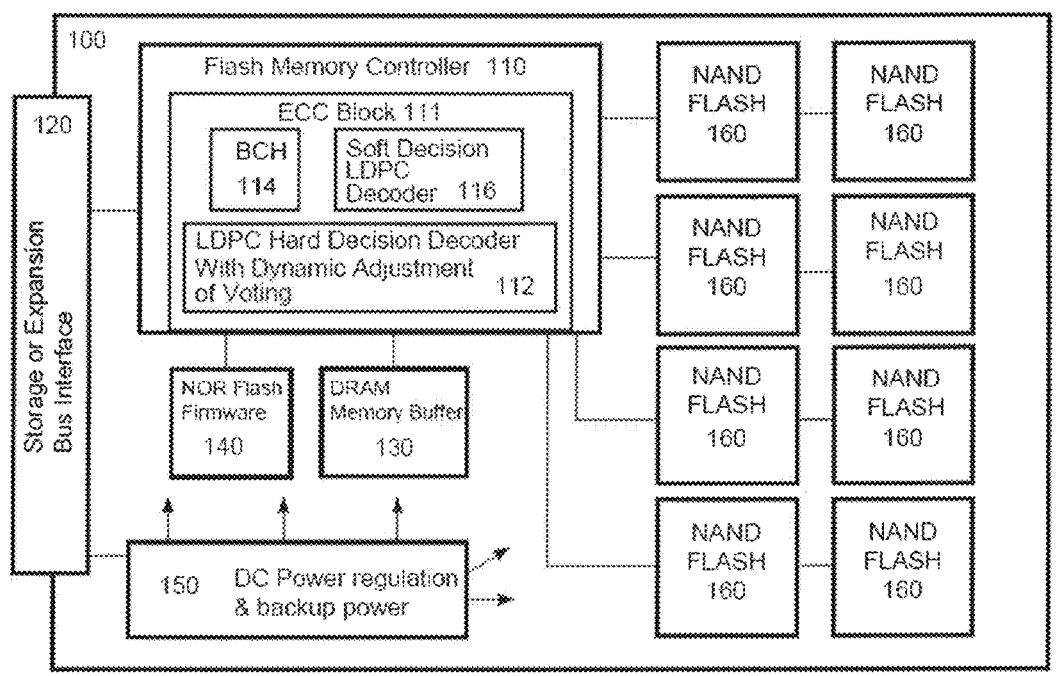
FIG. 1 illustrates a solid state drive NAND flash non-volatile memory with a hard-decision LDPC decoder in accordance with an embodiment of the present invention.

FIG. 1 illustrates a general SSD flash memory 100 with a flash memory controller 110 having an Encryption and Error Correction (ECC) block 111 with hard-decision LDPC decoder 112 having dynamically adjusted voting methods. The ECC block 111 may also include a BCH error corrector 114 and a soft-decision LDPC decoder 116. In one implementation, a frame is passed through the hard-decision LDPC decoder 112 core, then a BCH error corrector 114 and finally, if required, the soft-decision LDPC decoder 116.

The flash memory controller 110 provides the link between the storage or expansion bus interface 120 (which may be SATA, SCSI, SAS, PCIe or similar) and the NAND flash memory devices themselves, 160-167.

The number of flash memory devices may vary according to the storage capacity of the individual devices and the SSD as a whole, but would typically be a power of 2 such as 4, 8, 16, 32 and so on. The flash memory controller may comprise a single semiconductor device with on-chip ROM for firmware storage and RAM for working data structures and buffers, but there may also be provided external DRAM 130 for additional space for large data translation tables and buffers and external NOR flash 140 for upgradeable firmware storage. To provide the various voltages required by the flash memory controller and external memories, there will be DC power regulation circuitry 150 which may also include provision for backup power using large capacitors in order to safely manage the shutdown of the SSD in the event of sudden power removal or failure.

Figure 2:
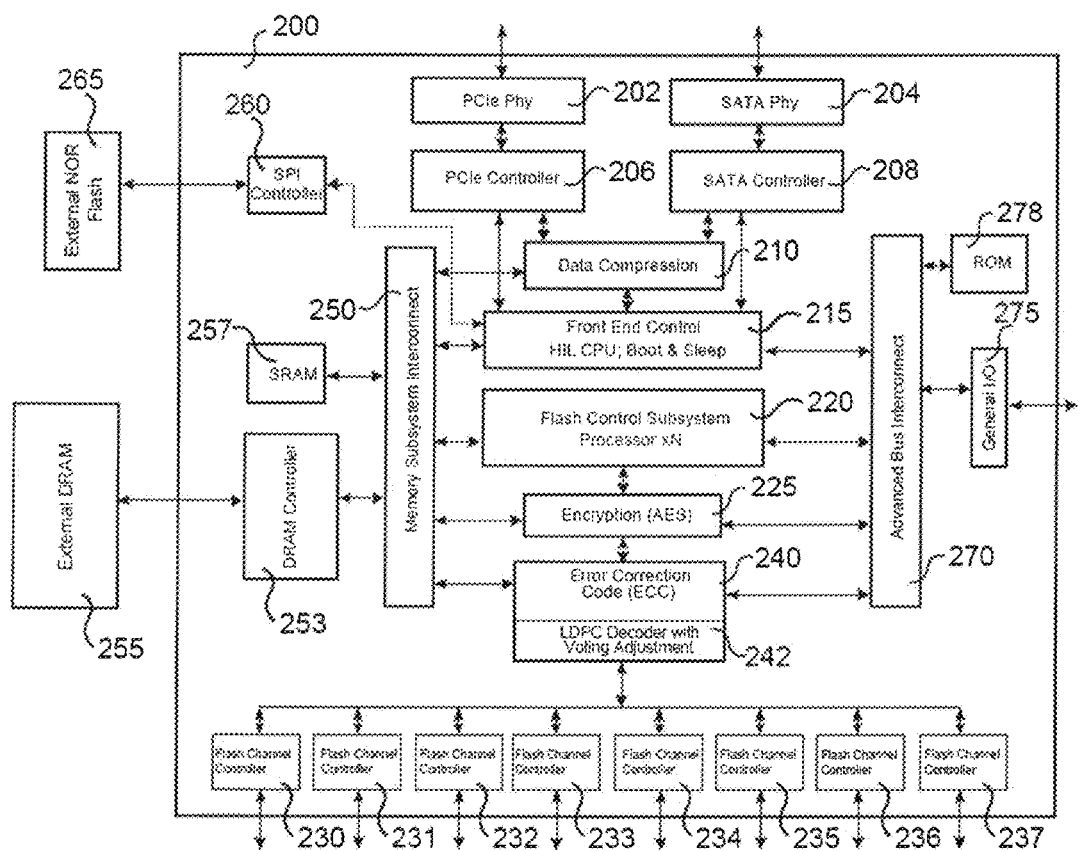
FIG. 2 is a NAND flash non-volatile memory controller having a hard-decision LDPC decoder in accordance with an embodiment of the present invention.

FIG. 2 illustrates in more detail an exemplary flash memory controller implementation. FIG. 2 shows a block diagram of a flash memory controller device used in a solid state disk (SSD) in accordance with an embodiment of the present invention.

In the example of FIG. 2, additional implementation details of a commercial flash controller are illustrated to show in more detail an example of how ECC may be used. In FIG. 2, the flash controller 200 is largely self contained, with External DRAM 255 and External NOR Flash 265 being the main external components apart from the NAND flash memory itself (not shown but which connects via flash control/data buses to the Flash Channel Controllers 230-237. Data is transferred between a host and the flash memory controller via PCIe Phy (physical layer) 202 and SATA Phy 204 and PCIe Controller 206 and SATA Controller 208 protocol stacks.

Data may then pass through data compression/decompression 210 or be buffered directly in DRAM 255. These PCIe and SATA functions operate under the control of a Front End Control unit 215, which contains the Host Interface Layer (HIL) CPU and a separate low power control processor subsystem which is responsible for managing low power operation sleep modes.

The Front End Control 215, Flash Control Subsystem 220, Encryption (AES) 225 and Error Correction Code (ECC) 240 hardware blocks are interconnected with a high bandwidth Memory System Interconnect 250 and an Advanced Bus Interconnect 270. Bulk data and critical data interchange between these components takes place on the Memory System Interconnect 250, while control and non-critical data interchange takes place via the Advanced Bus Interconnect 270. The ECC block 240 may include the hard-decision LDPC decoder 242 with voting method adjustment. As previously discussed, the ECC block may also include a soft-decision LDPC decoder (not shown in FIG. 2) and a BCH decoder (not shown in FIG. 2).

Both high speed on-chip SRAM 257 is used along with bulk external DRAM 255 via a DRAM controller 253. The Flash Control Subsystem 220 runs the flash firmware to manage the reading and writing of data in flash data pages and blocks to the NAND flash memories. Hardware blocks are provided to implement high speed data encryption and decryption to the AES standard 255 and also real time Error Correction Code (ECC) 240 encoding and decoding. Data is exchanged between the front end Data Compression 210 hardware block and the back end AES Encryption 255 and Error Correction Code 240 hardware blocks by intermediate storage of data buffer in SRAM 257 and External DRAM 255.

All data passes through the AES Encryption 255 and Error Correction Code 240 blocks before finally data is distributed to the NAND flash memory devices via multiple Flash Channel Controllers 230-237, where individual channels may be supporting multiple NAND flash read or write commands in parallel. General purpose I/O lines 275 are provided for functions such as external power management.

Figure 3:
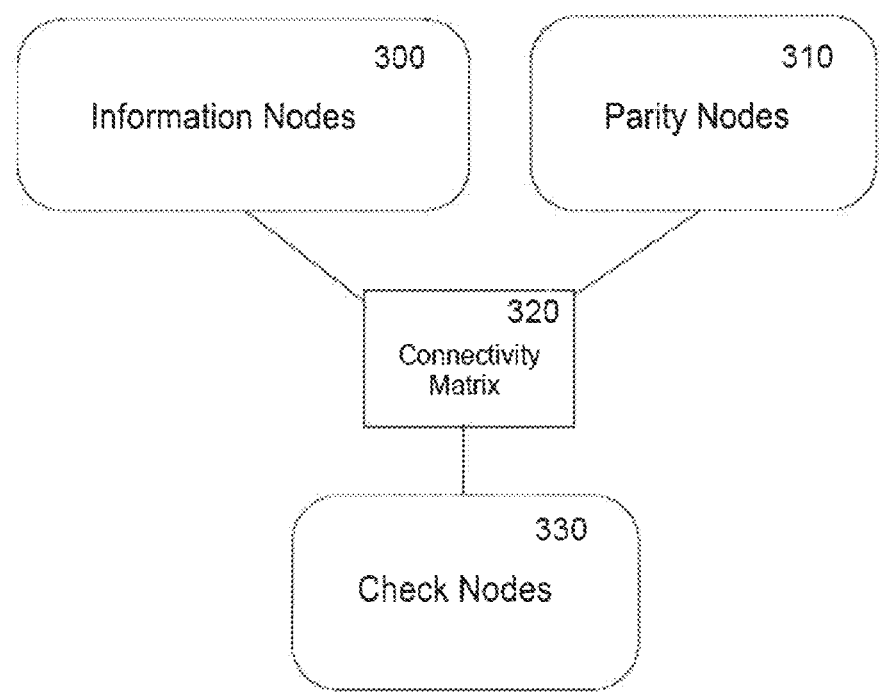
FIG. 3 illustrates aspects of LDPC decoding.

FIG. 3 illustrates aspects of LDPC. An LDPC data frame consists of information node bits 300 and parity node bits 310 (collectively called variable-nodes). The code is defined by a graph (connectivity matrix 320) connecting the information node bits 300 and parity node bits 310 to a collection of check-node bits 330, where there are equal numbers of check-node bits 330 and parity node bits 310. The values on the parity node bits 310 are chosen so that any given check-node 330, the xor (exclusive OR) sum of the information node and parity node bits 300 and 310 connected to the check-node 330 is 0.

Hard-decision LDPC bit flipping, majority voting decoding provides that for each check-node 330, the graph is followed and the xor sum calculated of bits directly connected to the check-node 330. If all xor sums are 0, the process ends with a successful decode. The process includes that for each variable node, the graph is followed to get the set bits value bi on the check-nodes 330 directly connected to the given node. If the equation $$-1 + \sum_i (2b_i - 1)$$

(where bi is the bit value on the ith check node 330) is greater than 0, then the process flips the bit on the variable node. The processing then iterates and goes back to the beginning and starts again. The syndrome for a given iteration is the number of xor sums on check-nodes 330 in the first stage which equal 1. However, in accordance with an embodiment of the present invention, the voting methods may be dynamically adjusted.

In one embodiment, the voting is influenced by increasing the number of failing check-nodes 330 required for a flip (the equation becomes $$-2 + \sum_i (2b_i - 1)\bigg)$$

or reducing the number of failing check-nodes 330 required for a flip (the equation becomes $$0 + \sum_i (2b_i - 1)\bigg).$$

In one embodiment, the history of syndromes and the degree of the variable-node are used as factors to adjust the bit flipping decisions. Consider that there is an original voting method, V. Other voting methods of different strengths may also be dynamically selected. In one embodiment, degree 2 nodes normally require 2 failing check-nodes to prompt a flip. This can't be strengthened, but it can be weakened. The weakened method is denoted "T2". Degree 3 nodes normally require 3 failing check-nodes to prompt a flip. This can't be strengthened but it can be weakened. The weakened method is denoted "T3". For degree 4 and above, the method can be either strengthened or weakened. Combinations of the above can be formed, e.g. T23 weakens the degree 2 and degree 3 requirements.

For tiny numbers of errors (2 or 3), there are a limited number of patterns the errors can form in the graph. Consequently, there are a limited number of initial syndrome values. By analyzing the effects of the various voting methods on these error patterns, the best sequence of methods can be chosen for a given code.

Figure 4:
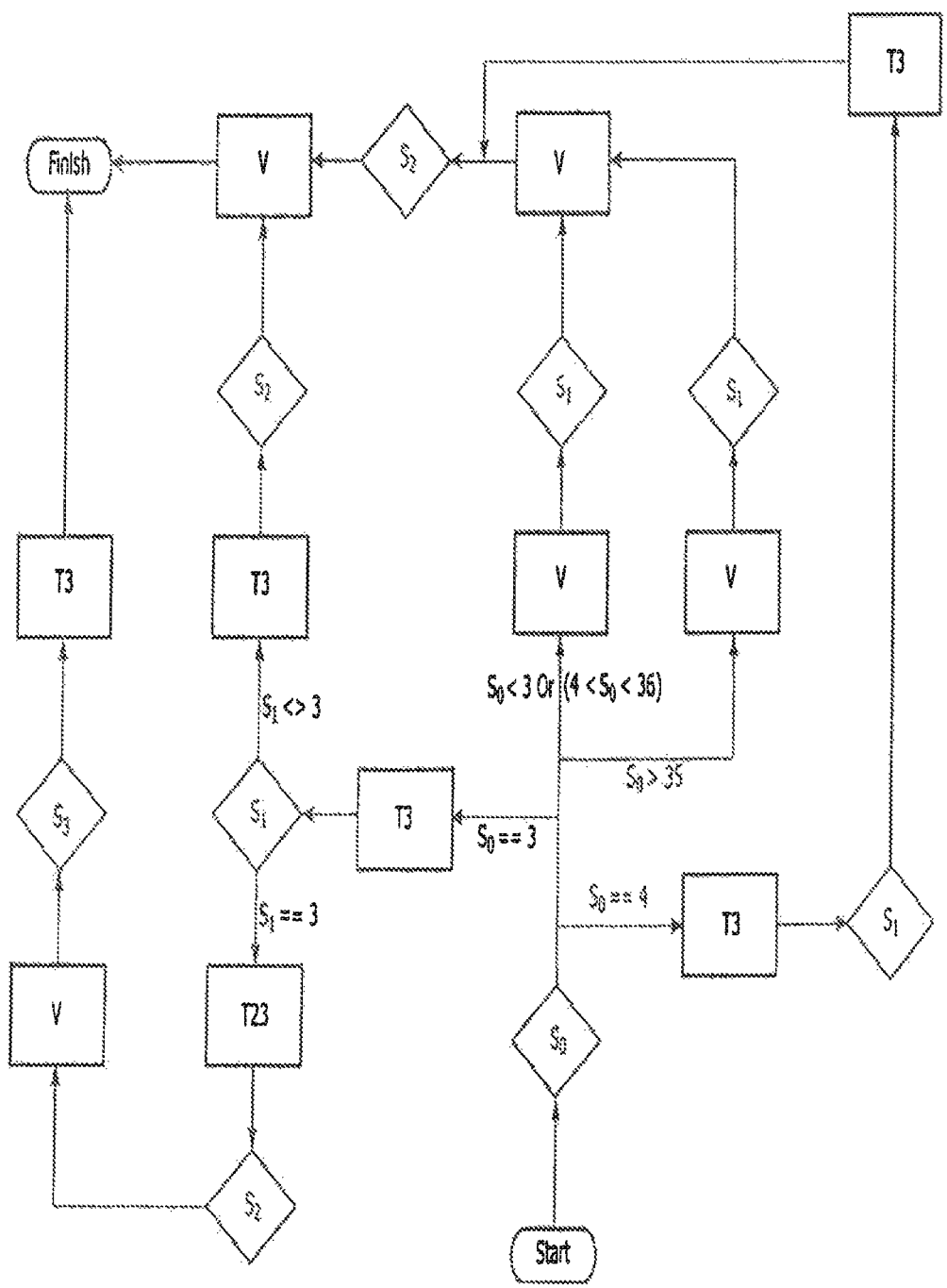
FIG. 4 is a flow chart of a method of hard-decision LDPC decoding in accordance with an embodiment of the present invention.

A flow chart illustrating a voting method is illustrated in FIG. 4, in accordance with an embodiment of the present invention. The flowchart in FIG. 4 is based around the method of choosing a voting scheme based on the value of the syndrome for a given stage of iteration. As described previously, the majority voting scheme involves calculating, for each check node, the xor sum of the variable node bit values (variable nodes consisting of information nodes and parity nodes) directly connected through the connectivity matrix to the check nodes. If the total of all the xor sums equals 0, then the decode has been successful and the information nodes contain the error corrected bits, otherwise if the total is non-zero, this is termed the syndrome.

A non-zero syndrome implies that some of the Variable Node bits are in error, which may be Information Nodes in error, Parity Nodes in error, or both. To try and correct this, a so-called bit-flipping algorithm is employed where some of the variable nodes will have their bits inverted, or 'flipped', in order to make the decode successful. The decision on whether to invert the node bit is based on the Check Nodes to which it is connected, according to the voting equation $$-1 + \sum_i (2b_i - 1)$$

(where bi is the bit value on the ith check node). If the result of the voting equation is greater than 0, the bit is inverted. If the check node bit value is 0, the portion in parentheses has a value of −1; if the node bit value is 0, the portion in parentheses has a value of 0. A variable node which is connected to N check nodes is termed 'degree-N'. Depending on the exact arrangement of the Connectivity Matrix, a variable node can be degree 2, 3, 4 or greater. Hence, for a degree 2 variable node, both check nodes need to have a bit value of 1 for the total to be greater than 0 (1). The total for 1 or 0 check nodes being 1 is −1 and −3 respectively. For a degree 3 variable node, all 3 check nodes must be 1 for the value to be greater than 0 (2) (the value for 2, 1, 0 check nodes being 1 is 0, −2, −4 respectively). For a degree 4 variable node, 3 of the 4 nodes must be 1 for the value to be greater than 0 (1). This is termed a "majority voting scheme" as a majority of the check nodes must be in a failure state (1) for the variable node to be flipped.

By manipulating the first '−1' term in the voting equation, the vote can either be relaxed or strengthened, by subtracting or adding a fixed value (1 in the example quoted) to the first term. For degree 2 nodes, the vote can obviously not be strengthened, only weakened, which scheme is termed "T2" in this example. Degree 3 nodes also cannot be strengthened, already requiring 3 nodes. The weakened scheme is termed "T3". Degree 4 and above nodes can be both strengthened and weakened, not shown in this example. A combination of strengthening and weakening of multiple degree values can be used, so T23 in the example strengthens both degree 2 and 3 variable node voting. Any other combination is of course also possible.

As shown in the flow chart in FIG. 4, on the first iteration after the Start the syndrome S0 is calculated. There are then 4 possible paths to a voting scheme based on the value of S0. If S0 is equal to 3, it takes the left hand branch and uses voting scheme T3. If S0 is equal to 4, it takes the lower right hand branch, also using voting scheme T3. If S0 is less than 3, or has a value between 5 and 35, it takes the upper branch to use scheme V. If S0 is greater than 35, it takes the upper right hand branch to use scheme V.

If S was 3, at the next iteration S is calculated. Now there are two possible branches, a lower one is taken if S equals 3 again, or the upper branch if S was not equal to 3. If the S was any other value, at the next iteration there is a fixed choice of voting scheme, but the voting scheme chosen depends on the selected branch.

While the flow chart is useful to describe the arrangement of voting schemes chosen at each iteration, which can be easily understood on visual inspection, a description which is more suited to interpretation by software algorithms which implement the scheme is needed. FIG. 5 shows an equivalent form of the same information as the flowchart, but in table form which can be more easily machine interpreted.

Each row in FIG. 5 corresponds to a decision point in the flow chart of FIG. 4, represented by a diamond (or possibly in some implementation more than one diamond). The first diamond is represented by row 0, which is the starting point and denoted by Address 0. There are 5 groups of repeated columns denoted Entry 0, 1, 2, 3, 4, representing the 5 possible value band ranges of the syndrome that are checked in the first diamond. When the syndrome falls into the band represented by the entry, then the Type denotes the voting scheme to be used. The band for the Entry n starts at 1+the end of the band range for Entry n−1 and has a length given by Band Length. For Entry 0, the band starts at 0. The AddrInc column then indicates by how much to increment the Address to arrive at the row value for the next decision point diamond.

Thus, Entry 0 for row 0 describes a syndrome band running from 0 with a length of 3. Therefore, the syndrome values covered are 0,1 and 2. If the syndrome is within this band, the voting method V is chosen, then the next decision point is given by Address=0+4=4. This entry represents the upper branch of the flow chart where S0<3. Entry 1 band starts at syndrome 1+2=3, for a length of 1, in other words the syndrome band covers just the value 3 and a syndrome within this band the voting scheme chosen is T3. This entry represents the left hand branch where S0==3, where the "==" symbol represents a logical "is equal to" to distinguish it from an assignment equals operator. The next decision point is given by Address=0+1=1. Entry 2 band starts at value 1+3=4, for a length of 1. In other words, the syndrome band covers just the value 4 and the voting scheme chosen is T3. Hence this entry represents the right hand branch where S0==4. The next decision point is given by Address=0+2=2. Entry 3 band starts at 1+4=5, for a length of 30. In other words, the syndrome band covers the values 5 to 35 inclusive and the voting scheme is V. This entry represents the upper branch where 4<S0<36. The next decision point address is given by Address=0+4=4. Entry 4 band starts at 1+35=36 for a length of −1, which is taken to mean the length is 'infinite', in other words the band covers any syndrome value 36 or greater. This entry represents the right hand branch S0>35 and move to Address=0+3=3 for the next decision point.

The next row with Address 1 represents the S1 diamond on the left hand branch. While there are 2 branches, upper and lower, from this decision point, the branches are represented by 3 Entries for syndrome bands. Entry 0 covers syndrome values 0, 1, 2, Entry 1 covers syndrome value 3 and Entry 2 covers syndrome values greater than 3. Entry 0 and 2 use voting scheme T3 and move to Address 1+4=5 for the next decision point, which is the upper branch from the S1 diamond. Entry 1 covers syndrome value 3 and uses the T23 voting scheme and moves to Address 1+5=6 for the next decision point, which is the lower branch from the S1 diamond.

The next row with Address 2 represents the S1 diamond on the lower right hand branch. Entry 0 covers all possible syndrome values from 0 with infinite length, using voting scheme T3. The Address moves to 2+3=5 for the next decision point.

The next row with Address 3 represents the S1 diamond in the upper right branch from method V after S0>35. Entry 0 covers all possible syndrome values from 0 with infinite length, using voting scheme V. The next row with Address 4 represents the S1 diamond to the left of this, Entry 0 also covering covers all possible syndrome values from 0 with infinite length, using voting scheme V. Both branches move to Address 5 (3+2 and 4+1).

The next row with Address 5 represents the S2 diamond in the upper row (and also the S2 diamond in the upper left). Entry 0 covers all possible syndrome values from 0 with infinite length, using voting scheme V. The next Address is −1 indicating that decoding has terminated.

The next row with Address 6 represents the S2 diamond on the lower left. Entry 0 covers all possible syndrome values from 0 with infinite length, using voting scheme V. The next Address is 6+1=7, where Address 7 represents the S3 diamond on the left. Entry 0 covers all possible syndrome values from 0 with infinite length, using voting scheme V. The next Address is −1 indicating that decoding has terminated.

This arrangement of the voting choice at each iteration is specific to this example embodiment, but in general it is possible to design an arrangement which can cope with any number of branches at each point of decision and any interconnection between the various branches.

Figure 6:
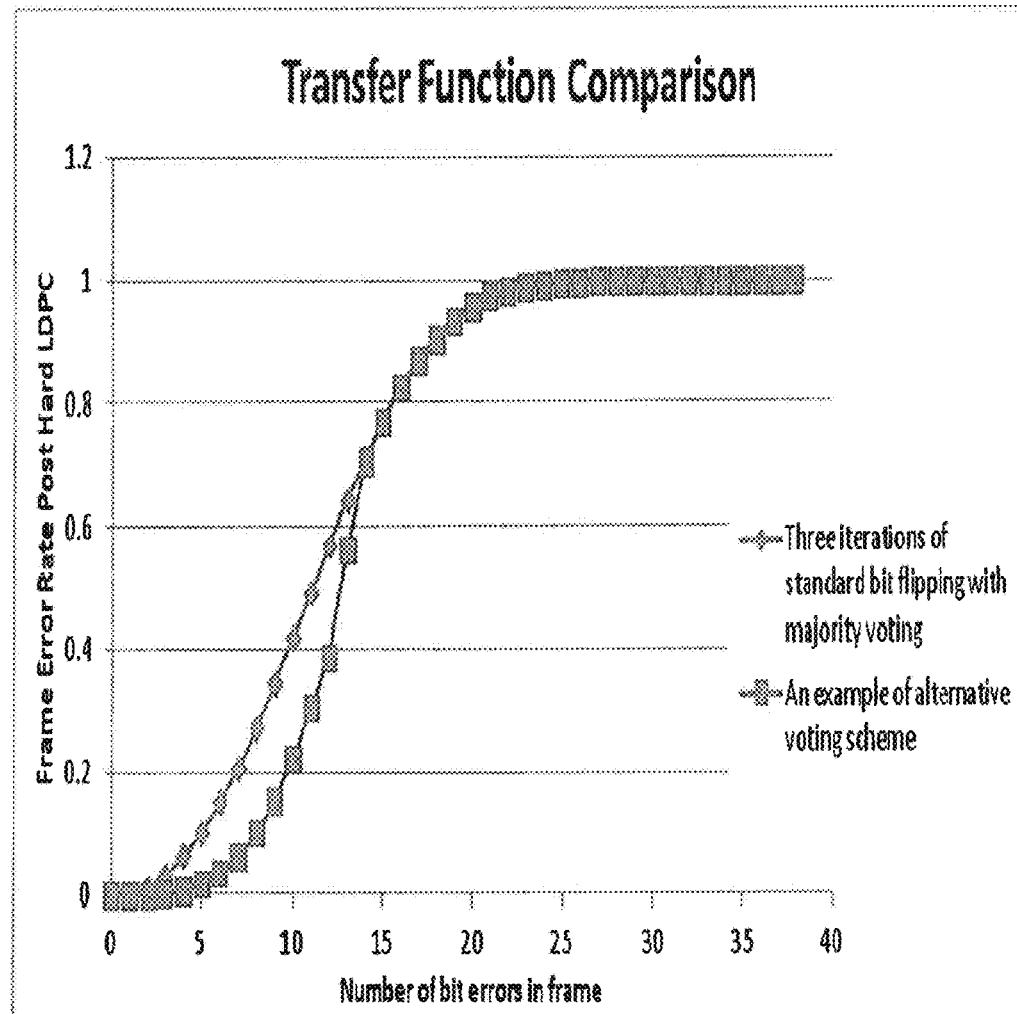
FIGS. 6 and 7 illustrate transfer functions associated with LDPC decoding in accordance with embodiments of the present invention.
Figure 7:
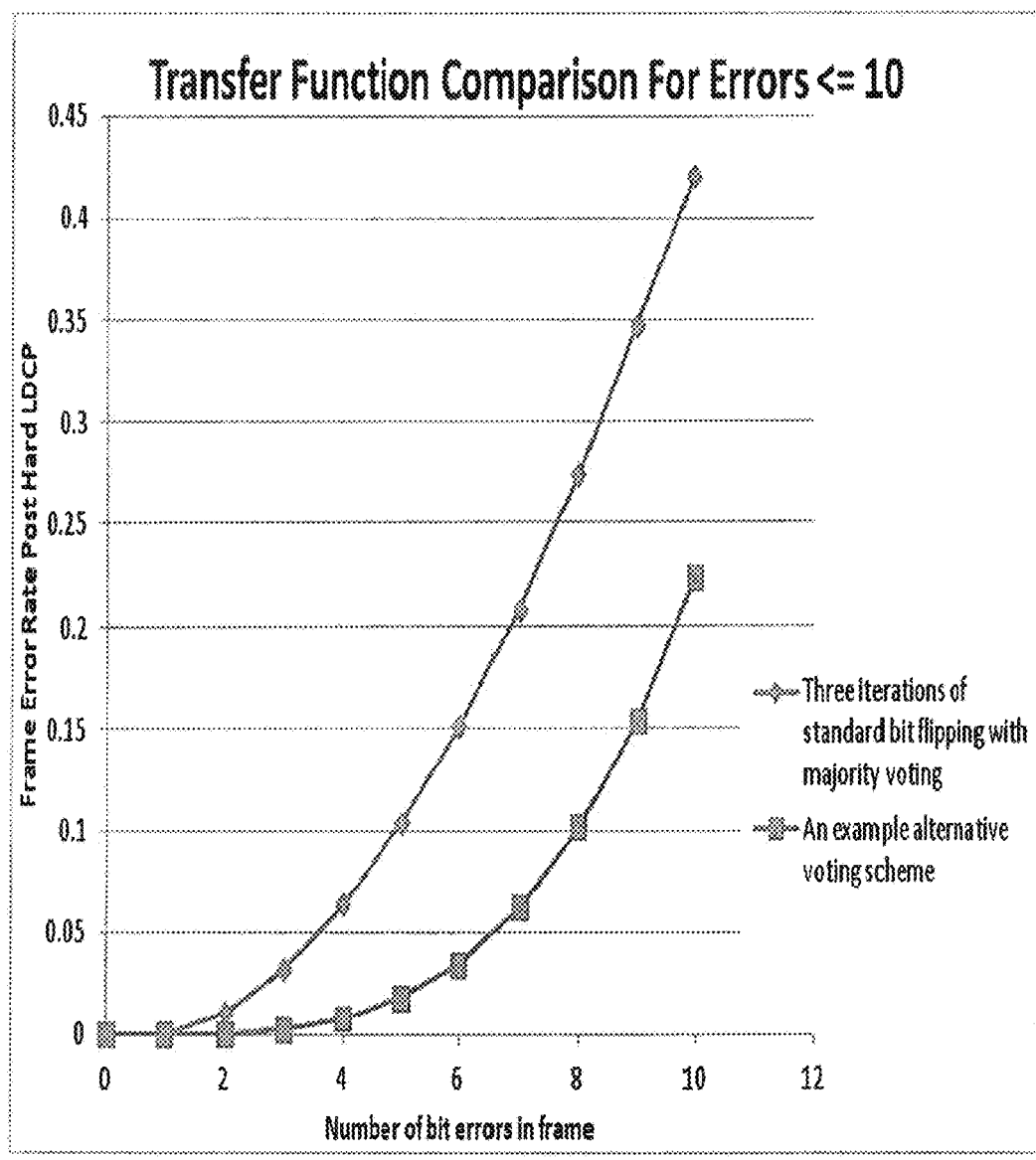

FIGS. 6 and 7 illustrate the transfer functions for the voting scheme illustrates in Table 1, below. In this example, the LDPC code is a 128_66_6 code corresponding to (66 groups of 128 information nodes and 6 groups of 128 parity/check nodes). As can be seen in FIG. 6, the number of bit errors in a frame is dramatically improved over standard bit flipping majority voting schemes when the number of bit errors in the frame is less than about 15. In particular, the results are dramatic for the situation that the number of bit errors in the frame is less than ten.

TABLE 1

| Syndrome 0 value | Syndrome 1 value | Method sequence |
|---|---|---|
| $S_0 < 3$ | | V, T3, V |
| 3 | 3 | T3, T23, V, T3 |
| | ≠3 | T3, T3, V |
| 4 | | T3, T3, T3, V |
| $5 \leq S_0 < 36$ | | V, T3, V |
| $S_0 \leq 36$ | | V, V, V |

As can be seen from FIG. 6, the alternate voting scheme has results that converge with conventional majority voting scheme for higher numbers of bit errors in a frame. Thus, it will be understood that the dynamic voting scheme of the present invention could be used either as an alternative to a conventional voting scheme or used in a complementary manner for the low bit error rate case. In addition, while the invention has been described in terms of embodiments of a memory controller for NAND flash memory, it will be understood that it may also be used for a memory controller for other types of non-volatile memory in general, including Phase Change Memory (PCM), Magneto-resistive RAM (MRAM), Spin Torque Transfer MRAM (STT-MRAM) Ferro-electric RAM (FeRAM or FRAM). While the invention has been described in conjunction with specific embodiments, it will be understood that it is not intended to limit the invention to the described embodiments. On the contrary, it is intended to cover alternatives, modifications, and equivalents as may be included within the spirit and scope of the invention as defined by the appended claims. The present invention may be practiced without some or all of these specific details. In addition, well known features may not have been described in detail to avoid unnecessarily obscuring the invention. In accordance with the present invention, the components, process steps, and/or data structures may be implemented using various types of operating systems, programming languages, computing platforms, computer programs, and/or general purpose machines. In addition, those of ordinary skill in the art will recognize that devices of a less general purpose nature, such as hardwired devices, field programmable gate arrays (FPGAs), application specific integrated circuits (ASICs), or the like, may also be used without departing from the scope and spirit of the inventive concepts disclosed herein. The present invention may also be tangibly embodied as a set of computer instructions stored on a computer readable medium, such as a memory device.

What is claimed is:

1. A method of Low Density Parity Check ("LDPC") decoding by an LDPC decoder, the LDPC decoder operable to perform the steps comprising of:
   receiving a plurality of encoded data; and
   iteratively selecting a voting requirement, among a plurality of voting requirements, for LDPC decoding of each received encoded data of the plurality of encoded data,
   wherein for each iteration of the LDPC decoder,
      the selecting of the voting requirement is based on a value of a syndrome of the received encoded data;
      employing a bit-flipping scheme of the LDPC decoder according to the selected voting requirement, and
      correcting the encoded data based on the respective selected voting requirement and the employed bit-flipping scheme.

2. The method of claim 1, wherein selecting the voting requirement adjusts the number failing check-nodes of the LDPC decoder required for a flip of a bit on a variable node of the LDPC decoder.

3. The method of claim 1 wherein the voting requirement is further selected based on values of syndromes of previous iterations of the LDPC decoder.

4. The method of claim 1 wherein the voting requirement is further selected based on a history of syndromes and a degree of a variable node of the LDPC decoder.

5. The method of claim 1 wherein the plurality of voting requirements comprises the voting requirement and at least one weakened voting requirement or at least one strengthened voting requirement, relative to the voting requirement, for LDPC decoding.

6. The method of claim 5, wherein the plurality of voting requirements comprises the voting requirement, the at least one weakened voting requirement, and the at least one strengthened voting requirement.

7. The method of claim 4, wherein if the degree of the variable node is two:
   requiring two failing check nodes to prompt a bit of the variable node to flip; and
   utilizing a weakened voting requirement, relative to a previously selected voting requirement, for LDPC decoding.

8. The method of claim 4, wherein if the degree of the variable node is three:
   requiring three failing check nodes to prompt a bit of the variable node to flip; and
   utilizing a weakened voting requirement, relative to a previously selected voting requirement, for LDPC decoding.

9. The method of claim 4, wherein if the degree of the variable node is four or more:
   utilizing either a weakened voting requirement for LDPC decoding or a strengthen voting requirement for LDPC decoding, relative to a previously selected voting requirement, for LDPC decoding.

10. The method of claim 1, wherein the voting requirement is further selected based on effects of the voting requirement on error patterns.

* * * * *